United States Patent
Kanno

(10) Patent No.: US 6,708,903 B2
(45) Date of Patent: Mar. 23, 2004

(54) TWO-FLUID CLEANING JET NOZZLE, CLEANING EQUIPMENT AND METHOD OF FABRICATING SEMICONDUCTOR DEVICE EMPLOYING THE SAME

(75) Inventor: Itaru Kanno, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/147,068

(22) Filed: May 17, 2002

(65) Prior Publication Data
US 2003/0089799 A1 May 15, 2003

(30) Foreign Application Priority Data
Nov. 14, 2001 (JP) ........................................ 2001-348962

(51) Int. Cl.7 ................................................ B05B 7/04
(52) U.S. Cl. ...................... 239/434; 239/433; 239/426; 239/595; 239/8
(58) Field of Search .................................. 239/104, 105, 239/291, 288.3, 288.5, 418, 426, 431, 433, 434, 589, 595, 8

(56) References Cited

U.S. PATENT DOCUMENTS

| 4,787,404 A | * | 11/1988 | Klosterman et al. ........ 134/198 |
| 5,725,154 A | * | 3/1998 | Jackson ....................... 239/135 |
| 5,918,817 A | * | 7/1999 | Kanno et al. ................. 239/433 |
| 5,942,045 A | * | 8/1999 | Raghavan et al. ............. 134/34 |
| 6,223,827 B1 | * | 5/2001 | Zuev et al. ..................... 169/9 |
| 6,234,402 B1 | * | 5/2001 | Ganan-Calvo ................. 239/8 |
| 6,386,466 B1 | * | 5/2002 | Ozawa et al. ................ 239/433 |

FOREIGN PATENT DOCUMENTS

JP 10-156229 6/1998 ............. B05B/7/04

* cited by examiner

Primary Examiner—Henry Bennett
Assistant Examiner—Amanda Flynn
(74) Attorney, Agent, or Firm—McDermott, Will & Emery

(57) ABSTRACT

A two-fluid cleaning jet nozzle comprises a mixing part mixing two types of externally supplied fluids with each other for preparing a fluid mixture, a straight pipe linearly and tubularly formed along a prescribed accelerating direction toward the surface of a cleaned substance for accelerating the aforementioned fluid mixture received from the mixing part along the aforementioned accelerating direction, and a bent part connected to an outlet of the straight pipe. The bent part has an inner surface communicating with the inner surface of the straight pipe. The inner surface of the bent part defines a convexly bent curved surface to spread outward with respect to a space receiving the fluid mixture injected from the straight pipe.

7 Claims, 5 Drawing Sheets

TWO-FLUID CLEANING JET NOZZLE, CLEANING EQUIPMENT AND METHOD OF FABRICATING SEMICONDUCTOR DEVICE EMPLOYING THE SAME

BACKGROUND OF THE INVENTION

1. Field of the Invention

The present invention relates to a two-fluid cleaning jet nozzle and cleaning equipment comprising the same. More particularly, it relates to a two-fluid cleaning jet nozzle and cleaning equipment for removing contaminants adhering to the surface of a substrate such as a semiconductor wafer, a liquid crystal substrate, a disk substrate or a photomask. It also relates to a method of fabricating a semiconductor device.

2. Description of the Prior Art

In general, it is known that various contaminants adhere onto the surface of a semiconductor wafer in a semiconductor fabrication process. When an insulator film or a metal film is formed on a semiconductor wafer by CVD (chemical vapor deposition) or sputtering, for example, particulate contaminants adhere to the surface of the formed film. Further, etching residues (resist residues) or metal contaminants adhere after pattern formation by dry etching. As a method of removing such contaminants, Japanese Patent Laying-Open No. 10-156229 (1998) proposes a method of injecting droplets from a two-fluid cleaning jet nozzle.

FIG. 9 is a sectional view of a conventional two-fluid cleaning jet nozzle 51. This two-fluid cleaning jet nozzle 51 injects droplets formed by mixing a gas and a liquid with each other in the air and collides the same against the surface of an unclean substance thereby cleaning the substance. In the two-fluid cleaning jet nozzle 51, a pressurized gas and a pressurized liquid are supplied through a gas inlet 2 and a liquid inlet 3 respectively, to be mixed with each other in a mixing part 21 shown in FIG. 9. Thus, the liquid is converted into droplets floating in the gas. The gas is supplied through the gas inlet 2 under a high pressure, to form a fast stream in a straight pipe 22. The droplets formed in the mixing part 21 are accelerated by the stream of the gas in the straight pipe 22. The accelerated droplets are reduced in particle diameter. Thus, the droplets are injected through an outlet 4 of the straight pipe 22.

FIG. 10 is a schematic sectional view of conventional cleaning equipment comprising the two-fluid cleaning jet nozzle 51. This cleaning equipment is now described with reference to a semiconductor wafer 10 to be cleaned. The cleaning equipment comprises a stage 11 for holding the semiconductor wafer 10, a motor 12 for rotating the stage 11, the two-fluid cleaning jet nozzle 51 directed to a surface, to be cleaned, of the semiconductor wafer 10 set on the stage 11, and a cleaning cup 52 for preventing the droplets from scattering in cleaning. The cleaning cup 52 is provided with downwardly directed discharge ports 53. Operations of the cleaning equipment are now described. The semiconductor wafer 10 is set on and fixed to the stage 11, which in turn is rotated by the motor 12 at a prescribed rotational frequency. The gas and the liquid are supplied into the two-fluid cleaning jet nozzle 51, which in turn injects the droplets and the gas from the forward end thereof. Consequently, the droplets collide against contaminants adhering to the surface of the semiconductor wafer 10 to remove the contaminants. The contaminants removed from the surface of the semiconductor wafer 10 and most of the droplets and the gas injected from the two-fluid cleaning jet nozzle 51 flow toward the outer periphery of the semiconductor wafer 10, to be discharged through the discharge ports 53.

While the contaminants and most of the liquid and the gas are discharged through the discharge ports 53, the liquid is partially converted to a mist and the contaminants originally adhering to the surface of the semiconductor wafer 10 rise up in the cleaning cup 52 along with particles originally contained in the gas, to disadvantageously re-adhere to the surface of the semiconductor wafer 10 in a certain probability.

In the conventional two-fluid cleaning jet nozzle 51 or the cleaning equipment comprising the same, most part of the injected gas is directly sprayed to the surface (hereinafter referred to as "cleaned surface") of the substance to be cleaned, and hence the cleaned surface is dried to readily allow adhesion of particles. When the removed contaminants rise up in the cleaning cup 52 as hereinabove described, the particles originally contained in the gas frequently collide against the cleaned surface, to disadvantageously adhere to the cleaned surface. In particular, a fine pattern formed on the surface of a semiconductor substrate or the like may be damaged due to collision with such particles contained in the gas.

Further, it is difficult to quickly discharge the liquid and the gas through the discharge ports 53 connected under the cleaned substance. Thus, fine droplets partially converted to a mist, temporarily removed contaminants and particles contained in the gas readily rise up in the cleaning cup 52, to readily adhere to the cleaned substance.

SUMMARY OF THE INVENTION

An object of the present invention is to provide a two-fluid cleaning jet nozzle and cleaning equipment capable of suppressing re-adhesion of contaminants to a cleaned surface, adhesion of particles and damage of a fine pattern resulting from collision with particles.

In order to attain the aforementioned object, a two-fluid cleaning jet nozzle according to an aspect of the present invention comprises a mixing part mixing two types of externally supplied fluids with each other for preparing a fluid mixture, a straight pipe linearly and tubularly formed along a prescribed accelerating direction toward the surface of a cleaned substance for accelerating the aforementioned fluid mixture received from the aforementioned mixing part along the aforementioned accelerating direction and a bent part connected to an outlet of the aforementioned straight pipe, while the aforementioned bent part has an inner surface communicating with the inner surface of the aforementioned straight pipe and this inner surface of the aforementioned bent part defines a convexly bent curved surface to spread outward with respect to a space receiving the aforementioned fluid mixture injected from the aforementioned straight pipe. According to this structure, droplets injected from the outlet of the straight pipe can linearly advance as such to collide against a cleaned surface and remove contaminants, while a gas injected from the outlet of the straight pipe flows along the inner surface of the bent part due to a Coanda effect, not to directly collide against the cleaned surface. Particles originally contained in the gas also move along the stream of the gas, to be prevented from colliding against the cleaned surface.

In order to attain the aforementioned object, a two-fluid cleaning jet nozzle according to another aspect of the present invention comprises a mixing part mixing two types of externally supplied fluids with each other for preparing a fluid mixture, a straight pipe linearly and tubularly formed along a prescribed accelerating direction for accelerating the aforementioned fluid mixture received from the aforementioned mixing part along the aforementioned accelerating direction and a gas shield arranged apart from an outlet of the aforementioned bent part in a direction substantially perpendicular to the aforementioned accelerating direction, and the aforementioned gas shield has an opening on a position intersecting with a line formed by extending the center line of the aforementioned straight pipe. According to this structure, most part of a gas collides against the gas shield, to be hardly sprayed to a cleaned surface. On the other hand, droplets rectilinearly advance as such due to the law of inertia to pass through the opening and collide against the cleaned surface, whereby only the droplets can be more reliably collided against the cleaned surface.

In order to attain the aforementioned object, cleaning equipment according to still another aspect of the present invention comprises a stage for receiving a cleaned substance thereon, a two-fluid cleaning jet nozzle arranged toward a position of the aforementioned stage for receiving the aforementioned cleaned substance, walls enclosing the aforementioned stage and a discharge port arranged on a position intersecting with a plane formed by extending a cleaned surface of the aforementioned cleaned substance set on the aforementioned stage. According to this structure, the discharge port is arranged on extension of a stream of a gas formed toward the outer periphery of the cleaned surface, whereby the gas can be smoothly discharged from the discharge port.

In order to attain the aforementioned object, cleaning equipment according to a further aspect of the present invention comprises a stage for receiving a cleaned substance thereon and a two-fluid cleaning jet nozzle arranged toward a position of the aforementioned stage for receiving the aforementioned cleaned substance, while the aforementioned two-fluid cleaning jet nozzle includes a mixing part mixing two types of externally supplied fluids with each other for preparing a fluid mixture, a straight pipe linearly and tubularly formed along a prescribed accelerating direction toward the surface of a cleaned substance for accelerating the aforementioned fluid mixture received from the aforementioned mixing part along the aforementioned accelerating direction and a bent part connected to an outlet of the aforementioned straight pipe, the aforementioned bent part has an inner surface communicating with the inner surface of the aforementioned straight pipe, this inner surface of the aforementioned bent part defines a convexly vent curved surface to spread outward with respect to a space receiving the fluid mixture injected from the aforementioned straight pipe, and an end of the aforementioned bent part is present in a plane substantially parallel to a cleaned surface of the aforementioned cleaned substance set on the aforementioned stage. According to this structure, a gas flowing along the inner surface of the bent part is discharged from the end of the bent part as a stream along the surface of the cleaned substance, whereby the gas is more smoothly discharged and can be prevented from rising or the like.

In order to attain the aforementioned object, cleaning equipment according to a further aspect of the present invention comprises a stage for receiving a cleaned substance thereon and a two-fluid cleaning jet nozzle arranged toward a position of the aforementioned stage for receiving the aforementioned cleaned substance, while the aforementioned two-fluid cleaning jet nozzle includes a mixing part mixing two types of externally supplied fluids with each other for preparing a fluid mixture, a straight pipe linearly and tubularly formed along a prescribed accelerating direction for accelerating the aforementioned fluid mixture received from the aforementioned mixing part along the aforementioned accelerating direction and a gas shield arranged apart from an outlet of the aforementioned bent part in a direction substantially perpendicular to the aforementioned accelerating direction, and the aforementioned gas shield has an opening on a position intersecting with a line formed by extending the center line of the aforementioned straight pipe. According to this structure, most part of a gas collides against the gas shield, to be hardly sprayed to a cleaned surface. On the other hand, droplets rectilinearly advance as such due to the law of inertia to pass through the opening and collide against the cleaned surface, whereby only the droplets can be more reliably collided against the cleaned surface for cleaning the cleaned surface.

In order to attain the aforementioned object, a method of fabricating a semiconductor device according to a further aspect of the present invention employs the two-fluid cleaning jet nozzle according to any of the aforementioned aspects. According to this method, the surface of a cleaned substance can be prevented from damage as well as re-adhesion of temporarily removed contaminants and adhesion of particles contained in a gas for enabling excellent cleaning, whereby a semiconductor device can be efficiently fabricated with a high yield.

In order to attain the aforementioned object, a method of fabricating a semiconductor device according to a further aspect of the present invention employs the cleaning equipment according to any of the aforementioned aspects. According to this method, the surface of a cleaned substance can be prevented from damage as well as re-adhesion of temporarily removed contaminants and adhesion of particles contained in a gas-for enabling excellent cleaning, whereby a semiconductor device can be efficiently fabricated with a high yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
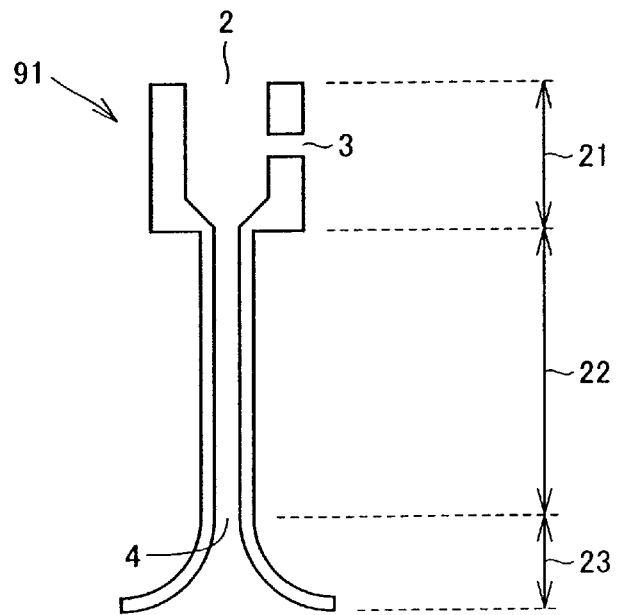
FIG. 1 is a sectional view of a two-fluid cleaning jet nozzle according to a first embodiment of the present invention.

A two-fluid cleaning jet nozzle 91 according to a first embodiment of the present invention is now described with reference to FIG. 1. As shown in FIG. 1, the two-fluid cleaning jet nozzle 91 comprises a bent part 23 connected to a straight pipe outlet 4 in addition to a mixing part 21 and a straight pipe 22 similar to those of the conventional two-fluid cleaning jet nozzle 51. The bent part 23 has an inner surface communicating with the inner surface of the straight pipe 22. As shown in FIG. 1, the inner surface of the bent part 23 defines a convexly bent curved surface to spread outward with respect to a space receiving fluids injected from the straight pipe 22.

Figure 2:
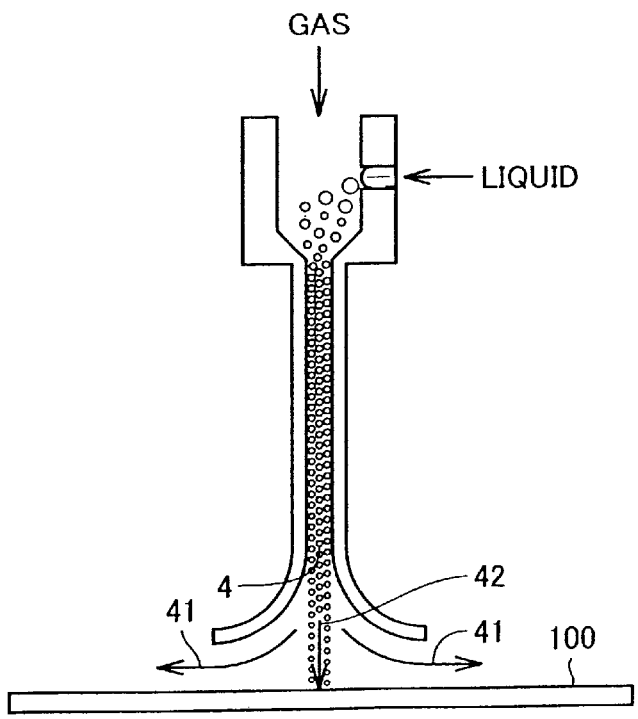
FIG. 2 is an explanatory diagram showing streams of a liquid and a gas in the two-fluid cleaning jet nozzle according to the first embodiment of the present invention.
Figure 9:
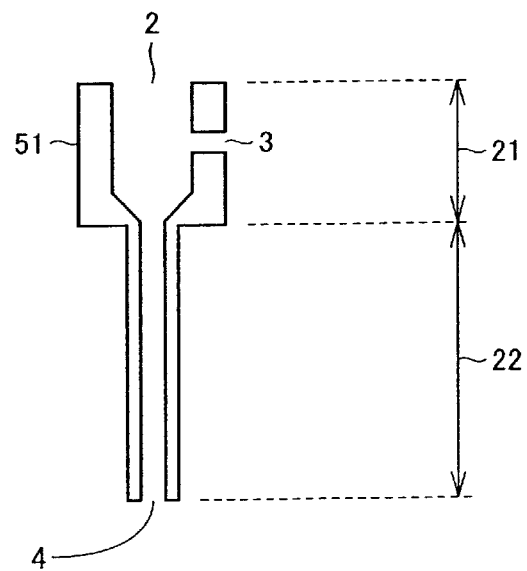
FIG. 9 is a sectional view of a conventional two-fluid cleaning jet nozzle.
Figure 10:
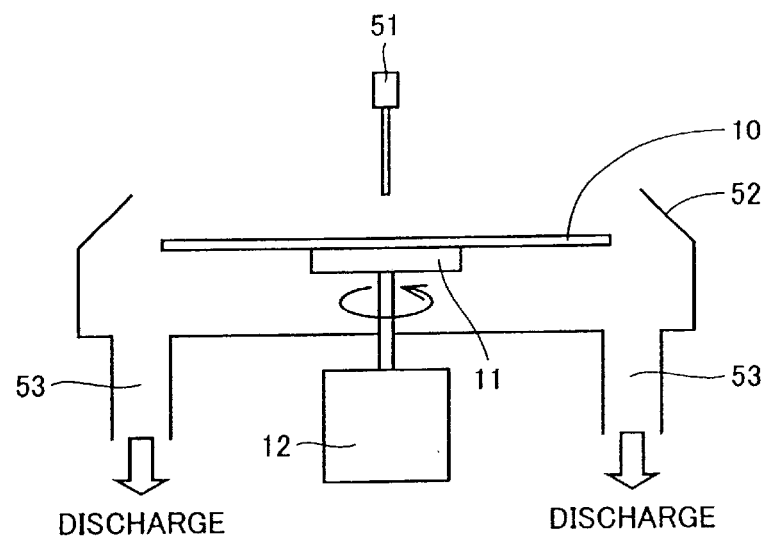
FIG. 10 is a sectional view of conventional cleaning equipment.

FIG. 2 schematically shows streams of a liquid and a gas in the two-fluid cleaning jet nozzle 91. The liquid and the gas are mixed with each other in the mixing part 21, to form droplets. The droplets passing through the straight pipe 22 along the stream of the gas are reduced in diameter. The gas injected from the straight pipe outlet 4 forms an outwardly spreading stream along the inner surface of the bent part 23 due to a Coanda effect as shown by arrows 41, and further forms a stream along a cleaned surface 100 after the same is discharged from the bent part 23. In the conventional two-fluid cleaning jet nozzle 51 (see FIG. 9), most part of the injected gas is so directly sprayed to the cleaned surface that the cleaned surface is dried to readily attract particles and the particles contained in the gas collide against the cleaned surface to adhere to the cleaned surface or damage a fine pattern formed on the cleaned surface. In the two-fluid cleaning jet nozzle 91 according to this embodiment, the droplets injected from the straight pipe outlet 4 collide against the cleaned surface 100 as such as shown by arrow 42, while the gas injected from the straight pipe outlet 4 flows along the inner surface of the bent part 23 as hereinabove described, not to directly collide against the cleaned surface 100. Particles originally contained in the gas also move along the stream of the gas, to be prevented from colliding against the cleaned surface 100. In general, the particles contained in the gas have small particle diameters of not more than 1 $\mu$m while the diameters of the injected droplets are several 10 $\mu$m. Thus, the particles having small mass move along the stream of the gas while the droplets having large mass and strong inertial force linearly advance toward the cleaned surface without the stream of the gas. Therefore, most part of the gas can be inhibited from being directly sprayed to the cleaned surface, whereby the cleaned surface is prevented from adhesion of particles and damage of a fine pattern.

The sectional area in the straight pipe 22 is preferably at least 2 mm$^2$ and not more than 20 mm$^2$. If this sectional area is smaller than 2 mm$^2$, the flow rate of the gas is excessively reduced to result in a slow injection speed for the droplets, a small quantity of the liquid injected as the droplets and reduction of cleaning efficiency. If the sectional area is larger than 20 mm$^2$, the flow rate of the gas is excessively increased, to result in inferior discharge efficiency of a space for cleaning and the aforementioned rising of a mist formed by the liquid.

The length of the straight pipe 22 is preferably at least 20 mm and not more than 200 mm. If the length of the straight pipe 22 is smaller than 20 mm, the droplets are so insufficiently accelerated that the injection speed is reduced, to result in insufficient detergency per droplet. If the droplets are injected at a slow speed, rectilinear inertial force of the droplets is so reduced that most droplets move along the inner surface of the bent part 23 along the stream of the gas and the number of droplets colliding with the cleaned surface is reduced. Therefore, the cleaning effect is reduced as a whole. If the length of the straight pipe 22 is larger than 200 mm, fluid resistance in the straight pipe 22 is so increased that the injection speed for the droplets is reduced to result in reduction of detergency per droplet and the overall cleaning effect. Therefore, the length of the straight pipe 22 is preferably at least 20 mm and not more than 200 mm.

The aforementioned preferable numerical ranges of the sectional area and the length of the straight pipe 22 are set on the basis of the following consideration: The acceleration for the droplets in the straight pipe 22 or the injection speed for the droplets depends on the length of the straight pipe 22, the speed of the gas flowing in the straight pipe 22, the flow rate of the gas and the flow rate of the liquid. Assuming that the shape of the straight pipe 22 is invariable, i.e., the sectional area and the length of the straight pipe 22 are constant, the flow velocity of the gas flowing in the straight pipe 22 as well as the injection speed for the droplets are reduced if the flow rate of the gas is reduced, for example. Also when the flow rate of the liquid is increased, the integrated mass of the gas and the liquid flowing in the straight pipe 22 is increased to reduce the acceleration for the droplets in the straight pipe 22 as well as the injection speed for the droplets. In order to avoid reduction of the injection speed for the droplets, therefore, the flow rate of the liquid must be limited in coincidence with the flow rate of the gas. If the flow rate of the liquid is excessively reduced, however, the number of the droplets is reduced to reduce the cleaning effect. Therefore, the flow rate of the liquid must be in excess of the lower limit. The speed of the gas in the straight pipe 22 depends on the sectional area of the straight pipe 22 and the flow rate of the gas. When the sectional area of the straight pipe 22 is reduced, for example, the flow rate of the gas must be reduced at the same rate, in order to keep the speed of the gas unchanged. In this case, the flow rate of the liquid must also be reduced at the same rate, in order not to reduce the injection speed for the droplets. If the flow rate of the liquid is excessively reduced, however, the cleaning effect is reduced as hereinabove described. When the sectional area of the straight pipe 22 is increased, the flow rate of the gas is also increased, while the discharge efficiency of a cleaning chamber is deteriorated, leading to the problem of adhesion of particles to the cleaned surface resulting from rising of a mist formed by the liquid caused in the prior art. In consideration of these points, the preferable numerical ranges of the sectional area and the length of the straight pipe 22 are set in the aforementioned manner.

(Second Embodiment)

Figure 3:
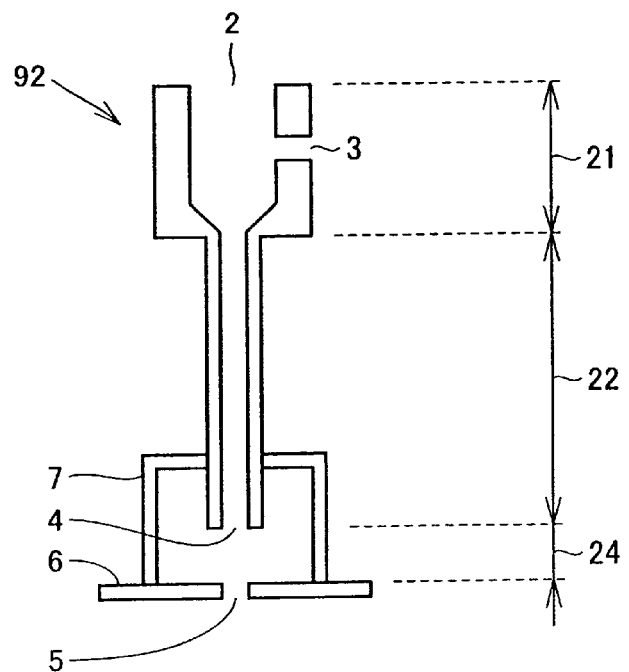
FIG. 3 is a sectional view of a two-fluid cleaning jet nozzle according to a second embodiment of the present invention.
Figure 4:
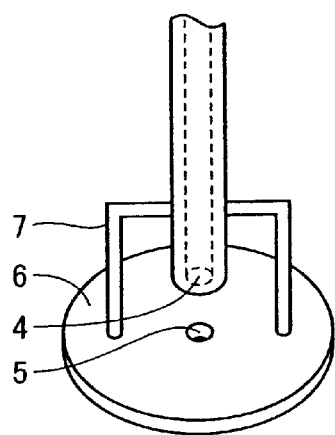
FIG. 4 is a perspective view of a portion around a gas shield in the two-fluid cleaning jet nozzle according to the second embodiment of the present invention.

A two-fluid cleaning jet nozzle 92 according to a second embodiment of the present invention is now described with reference to FIGS. 3 and 4. As shown in FIG. 3, the two-fluid cleaning jet nozzle 92 comprises a mixing part 21 and a straight pipe 22 similar to those according to the prior art or the first embodiment. In the two-fluid cleaning jet nozzle 92 according to this embodiment, a gas shield 6 is arranged on a position apart from a straight pipe outlet 4 through a clearance 24. FIG. 4 is a perspective view of a portion around the gas shield 6. The gas shield 6 may be connected with the straight pipe 22 through some mounting member 7, as shown in FIGS. 3 and 4. The gas shield 6 is arranged in a direction substantially perpendicular to that accelerated by the straight pipe 22, i.e., the accelerating direction, and has an opening 5 on a position intersecting with a line formed by extending the center line of the straight pipe 22.

Droplets injected from the straight pipe outlet 4 rectilinearly advance as such according to the law of inertia and collide against a cleaned surface through the opening 5 of the gas shield 6. Most part of a gas injected from the straight pipe outlet 4 is not so rectilinear as the droplets and collides against the gas shield 6, to form a stream along the upper surface of the gas shield 6. Therefore, the gas is hardly sprayed to the cleaned surface. Thus, the cleaned surface can be collided with the droplets with small collision with the gas.

The distance of the clearance 24 can be properly adjusted so that the droplets can pass through the opening 5 while only a small quantity of gas passes through the opening 5.

(Third Embodiment)

Figure 5:
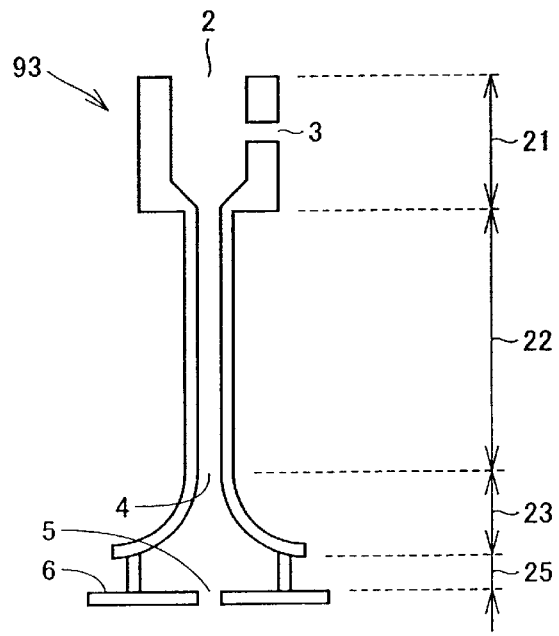
FIG. 5 is a sectional view of a two-fluid cleaning jet nozzle according to a third embodiment of the present invention.

A two-fluid cleaning jet nozzle 93 according to a third embodiment of the present invention is described with reference to FIG. 5. This two-fluid cleaning jet nozzle 93 is formed by connecting a gas shield 6 to a two-fluid cleaning jet nozzle similar to the two-fluid cleaning jet nozzle 91 according to the first embodiment.

In this two-fluid cleaning jet nozzle 93, most part of a gas is not directly sprayed to a cleaned surface but discharged sideward through a clearance 25 between a bent part 23 and the gas shield 6 due to effects similar to those of the bent part 23 described with reference to the first embodiment and the gas shield 6 described with reference to the second embodiment. Therefore, the cleaned surface can be prevented from adhesion of particles as well as damage of a fine pattern caused by collision with particles.

(Fourth Embodiment)

Figure 6:
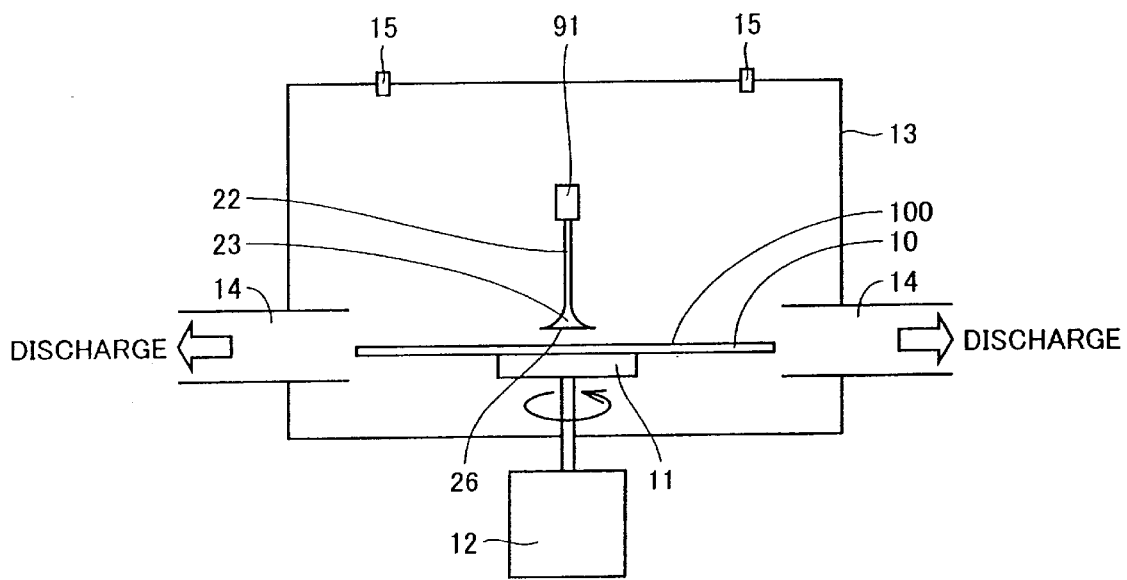
FIG. 6 is a sectional view of exemplary cleaning equipment according to a fourth embodiment of the present invention.

Cleaning equipment according to a fourth embodiment of the present invention is described with reference to FIG. 6. This cleaning equipment comprises a stage 11 for holding a semiconductor wafer 10 while directing a cleaned surface 100 upward, a motor 12 for rotating the stage 11 and the two-fluid cleaning jet nozzle 91 described with reference to the first embodiment. The cleaning equipment further comprises a cleaning chamber 13 including walls enclosing the stage 11 and the two-fluid cleaning jet nozzle 91. On the walls of the cleaning chamber 13, discharge ports 14 are arranged on positions intersecting with a plane obtained by extending the cleaned surface 100 of the semiconductor wafer 10 to be cleaned.

An end 26 of the bent part 23 is present in a plane substantially parallel to the cleaned surface 100 of the semiconductor wafer 10. Referring to FIG. 6, the straight pipe 22 is perpendicular to the cleaned surface 100 and hence the end 26 is substantially perpendicular to the straight pipe 22. Even if the straight pipe 22 is obliquely arranged with respect to the cleaned surface 100, the end 26 is arranged in a plane substantially parallel to the cleaned surface 100.

In cleaning, the semiconductor wafer 10 is set on and fixed to the stage 11, which in turn is rotated by the motor 12 at a prescribed rotational frequency. A gas and a liquid are supplied into the two-fluid cleaning jet nozzle 91, which in turn injects droplets and the gas through the forward end thereof The injected droplets collide against the cleaned surface 100 of the semiconductor wafer 10. On the other hand, the injected gas flows along the inner surface of the bent part 23, forms a stream along the cleaned surface 100 of the semiconductor wafer 10 and further flows toward the outer periphery of the semiconductor wafer 10. The discharge ports 14 are so arranged on extension of the gas as to discharge the gas from the cleaning chamber 13. The droplets colliding against the cleaned surface 100 are also discharged from the cleaning chamber 13 through the discharge ports 14 due to centrifugal force following rotation of the semiconductor wafer 10 along the stream of the gas around the cleaned surface 100.

Figure 7:
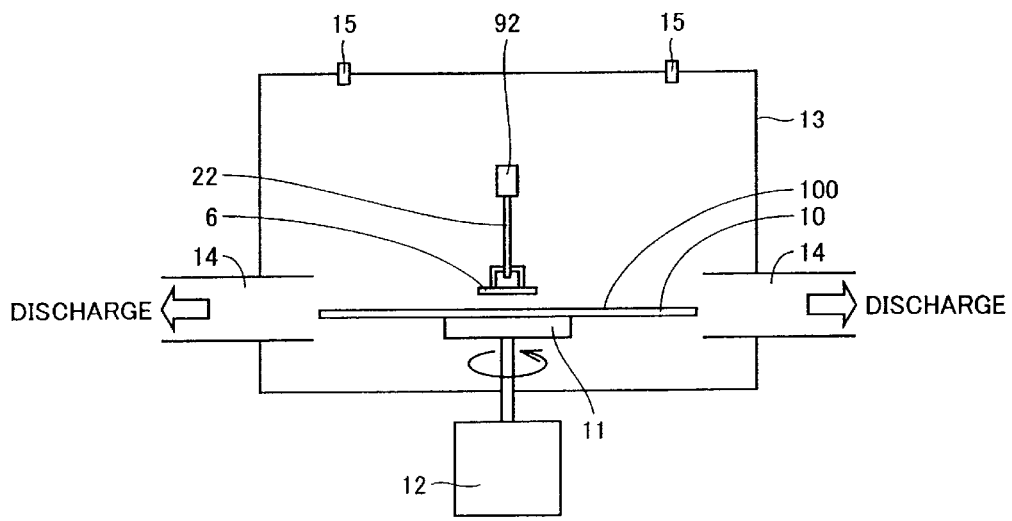
FIG. 7 is a sectional view of another exemplary cleaning equipment according to the fourth embodiment of the present invention.
Figure 8:
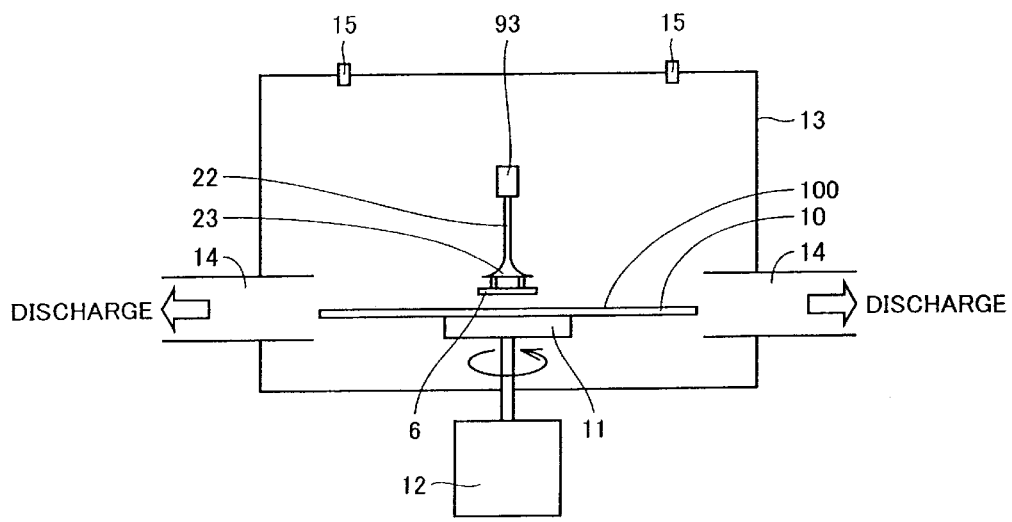
FIG. 8 is a sectional view of still another exemplary cleaning equipment according to the fourth embodiment of the present invention.

The cleaning equipment, comprising the two-fluid cleaning jet nozzle 91 described with reference to the first embodiment in the above example, may alternatively comprise another two-fluid cleaning jet nozzle. For example, the cleaning equipment may comprise the two-fluid cleaning jet nozzle 92 as shown in FIG. 7, or the two-fluid cleaning jet nozzle 93 as shown in FIG. 8. In this cleaning equipment, most part of the gas flows sideward without directly colliding against the cleaned surface 100, whereby the cleaned surface 100 can be prevented from re-adhesion of contaminants and adhesion of particles contained in the gas as well as damage resulting from collision with the particles.

When the cleaning chamber 13 is brought into a closed structure cut off from the outside air and comprises a gas supply port 15 for supplying a gas such as nitrogen or dry air into the cleaning chamber 13, the gas and the liquid injected from the two-fluid cleaning jet nozzle 91 are more efficiently and quickly discharged from the cleaning chamber 13. Particularly when the internal pressure of the cleaning chamber 13 is rendered lower than the atmospheric pressure by well-known internal air pressure maintaining means, the difference between the pressure of the gas in the two-fluid cleaning jet nozzle 91 and the pressure in the cleaning chamber 13 is more increased so that the gas injected from the two-fluid cleaning jet nozzle 91 readily flows along the inner surface of the bent part 23 or the like. Therefore, the gas can be more reliably prevented from directly colliding against the cleaning surface 100.

(Fifth Embodiment)

A method of fabricating a semiconductor device according to a fifth embodiment of the present invention includes a step of performing cleaning with the two-fluid cleaning jet nozzle or the cleaning equipment according to any of the aforementioned embodiments as part of the fabrication steps thereof According to this cleaning step, the surface of a cleaned substance can be prevented from damage, re-adhesion of temporarily removed contaminants and adhesion of particles contained in a gas for enabling excellent cleaning, whereby a semiconductor device can be efficiently fabricated with a high yield.

According to the present invention, droplets injected from an outlet of a straight pipe can rectilinearly advance as such and collide against a cleaned surface for removing contaminants while a gas injected from the outlet of the straight pipe flows along the inner surface of a bent part connected to the straight pipe due to a Coanda effect, whereby rising can be prevented for preventing re-adhesion of the contaminants or the like. Most part of the injected gas does not directly collide against the cleaned surface while particles originally contained in the gas move along a stream of the gas, whereby the particles can be prevented from adhering to or colliding against the cleaned surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A two-fluid cleaning jet nozzle for cleaning semiconductor devices, comprising:
   a mixing part mixing two types of externally supplied fluids with each other for preparing a fluid mixture;
   a straight pipe linearly and tubularly tuned along a prescribed accelerating direction toward the surface of a cleaned semiconductor substance for accelerating said fluid mixture received from said mixing part along said accelerating direction; and
   a bent part connected to an outlet of said straight pipe, wherein
      said bent part has an inner surface communicating with the inner surface of said straight pipe, and said inner surface of said bent part defines a convexly bent curved surface to spread outward with respect to a space receiving said fluid mixture injected from said straight pipe.

2. The two-fluid cleaning jet nozzle according to claim 1, further comprising a gas shield arranged apart from an end of said bent part in a direction substantially perpendicular to said accelerating direction, wherein
   said gas shield has an opening on a position intersecting with a line formed by extending a center line of said straight pipe along the prescribed accelerating direction.

3. The two-fluid cleaning jet nozzle according to claim 1, wherein the length of said straight pipe is at least 20 mm and not more than 200 mm.

4. A method of fabricating a semiconductor device employing the two-fluid cleaning jet nozzle according to claim 1.

5. Cleaning equipment for cleaning semiconductor devices comprising:
   a stage for receiving a cleaned semiconductor substance thereon; and
   a two-fluid cleaning jet nozzle arranged toward a position of said stage for receiving said cleaned substance, wherein
      said two-fluid cleaning jet nozzle includes:
         a mixing part mixing two types of externally supplied fluids with each other for preparing a fluid mixture,
         a straight pipe linearly and tubularly formed along a prescribed accelerating direction toward the surface of a cleaned substance for accelerating said fluid mixture received from said mixing part along said accelerating direction, and
         a bent part connected to an outlet of said straight pipe, and
         said bent part has an inner surface communicating with the inner surface of said straight pipe, said inner surface of said bent part defines a convexly bent curved surface to spread outward with respect to a space receiving said fluid mixture injected from said straight pipe, and an end of said bent part is present in a plane substantially parallel to a cleaned surface of said cleaned substance set on said stage.

6. A two-fluid cleaning jet nozzle for cleaning semiconductor devices, comprising:
   a mixing part mixing two types of externally supplied fluids with each other for preparing a fluid mixture;
   a straight pipe linearly and tubularly formed along a prescribed accelerating direction toward the surface of a cleaned semiconductor substance for accelerating said fluid mixture received from said mixing part along said accelerating direction; and
   a gas shield arranged apart from an outlet of said straight pipe in a direction substantially perpendicular to said accelerating direction, wherein
      said gas shield has an opening on a position intersecting with a line formed by extending the center line of said straight pipe.

7. A two-fluid cleaning jet nozzle comprising:
   a mixing part having a first sectional area mixing two types of externally supplied fluids with each other for preparing a fluid mixture;
   a straight pipe having a second sectional area linearly and tubularly formed along a prescribed accelerating direction toward the surface of a cleaned substance for accelerating said fluid mixture received from said mixing part along said accelerating direction, wherein said first sectional area is greater than said second sectional area; and
   a bent part connected to an outlet of said straight pipe, wherein
      said bent part has an inner surface communicating with the inner surface of said straight pipe, and said inner surface of said bent part defines a convexly bent curved surface to spread outward with respect to a space receiving said fluid mixture injected from said straight pipe.

* * * * *